US011919769B2

(12) United States Patent
Uddin et al.

(10) Patent No.: US 11,919,769 B2
(45) Date of Patent: *Mar. 5, 2024

(54) SENSOR WITH DIMPLE FEATURES AND IMPROVED OUT-OF-PLANE STICTION

(71) Applicant: InvenSense, Inc., San Jose, CA (US)

(72) Inventors: Ashfaque Uddin, San Jose, CA (US); Daesung Lee, San Jose, CA (US); Alan Cuthbertson, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/071,322

(22) Filed: Nov. 29, 2022

(65) Prior Publication Data

US 2023/0100960 A1 Mar. 30, 2023

Related U.S. Application Data

(62) Division of application No. 17/206,079, filed on Mar. 18, 2021, now Pat. No. 11,542,154.

(51) Int. Cl.
*B81C 1/00* (2006.01)
*B81B 7/00* (2006.01)

(52) U.S. Cl.
CPC .......... *B81C 1/00238* (2013.01); *B81B 7/008* (2013.01); *B81C 2201/013* (2013.01); *B81C 2203/035* (2013.01)

(58) Field of Classification Search
CPC ... B81B 3/001; B81B 7/008; B81B 2207/012; B81B 2201/0235; B81B 2201/0242; B81C 1/00238; B81C 2203/035; B81C 2201/013
USPC .................................................. 257/415, 438
See application file for complete search history.

(56) References Cited

U.S. PATENT DOCUMENTS

| 11,542,154 | B2* | 1/2023 | Uddin | B81B 3/001 |
| 2021/0107785 | A1* | 4/2021 | Lee | B81C 1/00238 |
| 2022/0106188 | A1* | 4/2022 | Lee | B81B 7/0006 |

* cited by examiner

*Primary Examiner* — Hrayr A Sayadian

(57) ABSTRACT

A method includes fusion bonding a handle wafer to a first side of a device wafer. The method further includes depositing a first mask on a second side of the device wafer, wherein the second side is planar. A plurality of dimple features is formed on an exposed portion on the second side of the device wafer. The first mask is removed from the second side of the device wafer. A second mask is deposited on the second side of the device wafer that corresponds to a standoff. An exposed portion on the second side of the device wafer is etched to form the standoff. The second mask is removed. A rough polysilicon layer is deposited on the second side of the device wafer. A eutectic bond layer is deposited on the standoff. In some embodiments, a microelectro-mechanical system (MEMS) device pattern is etched into the device wafer.

13 Claims, 10 Drawing Sheets

Depositing a third mask on the second side of the device wafer after depositing the eutectic bond layer and further patterning the third mask to retain a portion corresponding to the standoff
2020

Depositing a fourth mask on the second side of the device wafer prior to etching the MEMS device pattern, and patterning the fourth mask to remove a portion of the fourth mask that corresponds to the MEMS device pattern
2022

Etching a micro-electro-mechanical system (MEMS) device pattern into the device wafer
2024

Optionally self-assembled monolayer (SAM) coating the MEMS device pattern, the plurality of dimple features, and interior of cavity formed between the handle wafer and the device wafer
2026

Eutecticly bonding the eutectic bond layer on the standoff to a metal pad on a complementary metal-oxide-semiconductor (CMOS)
2028

Figure 20B

SENSOR WITH DIMPLE FEATURES AND IMPROVED OUT-OF-PLANE STICTION

RELATED APPLICATIONS

This is a divisional patent application that claims the benefit and priority to the U.S. patent application Ser. No. 17/206,079 that was filed on Mar. 18, 2021, which is incorporated herein by reference in its entirety.

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc.

Stiction causes reliability issues for MEMS devices. Surface roughness may be introduced in some MEMS devices, e.g., by using polysilicon, in order to reduce stiction. Surface roughness increases with increased thickness of polysilicon layer, but unfortunately increasing thickness of polysilicon causes wafer handling issues in the deposition furnace since wafer is stuck onto the wafer boat due to thick polysilicon films. Moreover, increasing roughness using polysilicon layer, as an example, degrades the eutectic bond quality between the MEMS and a complementary metal-oxide semiconductor ("CMOS") due to higher roughness. Additionally, gyro cavity pressure undesirably increases due to increased outgassing from the self-assembled monolayer (SAM) coating layer on the rough polysilicon surface. Furthermore, increasing roughness using polysilicon layer causes insufficient dopant diffusion into the polysilicon from the actuator substrate causing parasitic resistance and capacitance effects.

SUMMARY

Provided herein is a method including fusion bonding a handle wafer to a first side of a device wafer. The method further includes depositing a first mask on a second side of the device wafer, wherein the second side is planar. According to some embodiments, a plurality of dimple features is formed on an exposed portion on the second side of the device wafer. The first mask is removed from the second side of the device wafer. A second mask is deposited on the second side of the device wafer that corresponds to a standoff. An exposed portion on the second side of the device wafer is etched to form the standoff. The second mask is removed. A rough polysilicon layer is deposited on the second side of the device wafer. According to some embodiments, a eutectic bond layer is deposited on the standoff. In some embodiments, the method includes etching a micro-electro-mechanical system (MEMS) device pattern into the device wafer.

Provided herein is another method including fusion bonding a handle wafer to a first side of a device wafer. A first mask is deposited on a second side of the device wafer, wherein the second side is planar. A plurality of dimple features is formed on an exposed portion on the second side of the device wafer. The first mask is removed. A rough polysilicon layer is deposited on the second side of the device wafer. A eutectic bond layer is deposited on the rough polysilicon layer. In some embodiments, a second mask is deposited on the eutectic bond layer and patterned. A portion on the second side of the device wafer uncovered by the second mask is etched to form the standoff where the second mask is deposited. A micro-electro-mechanical system (MEMS) device pattern is etched into the device wafer.

These and other features and advantages will be apparent from a reading of the following detailed description.

BRIEF DESCRIPTION OF DRAWINGS

FIGS. 20A-B show an exemplary flow diagram for creating a sensor with improved stiction according to one aspect of the present embodiments.

DESCRIPTION

Figure 1:
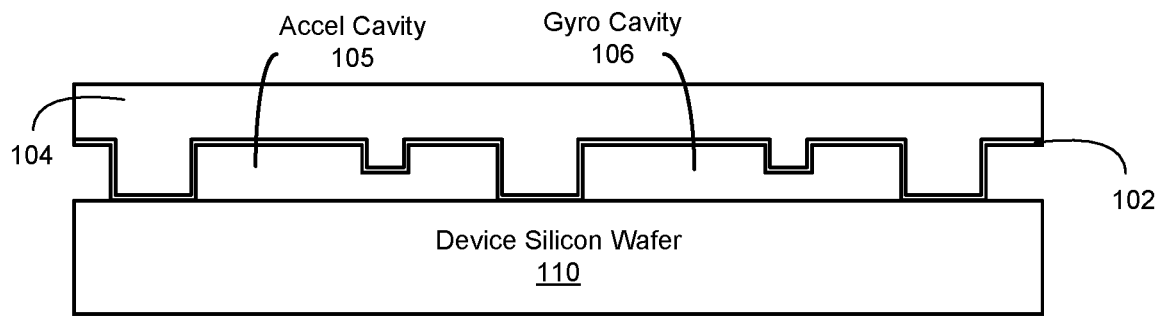
FIG. 1 shows a MEMS wafer at an early stage of manufacture according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

Stiction causes reliability issues for MEMS ("micro-electro-mechanical systems") devices, e.g., when proof mass becomes in contact with a bumpstop on a complementary metal-oxide semiconductor ("CMOS"). Stiction (e.g., out-of-plane stiction) is controlled by microscopic surface roughness and surface morphology. As such, in order to reduce stiction, dimple features may be patterned (topography) and their roughness may be controlled on the proof mass of MEMS device that may contact the bumpstop on the CMOS. In some embodiments, the dimple features are created by texturing the surface, e.g., post, hole, stripe, etc., of the proof mass and/or increasing its roughness. The dimple features may be designed such that their topography and roughness are optimized to enhance the stiction performance (i.e. improve out-of-plane stiction between the proof mass and bumpstop on the CMOS). It is appreciated that the proof mass surface modification may be localized to the area in proximity of the bumpstop on the CMOS to reduce any parametric shift. It is appreciated that in some embodiments, the dimple features are designed that are oversized in comparison to the bumpstop in order to compensate for misalignment between the standoff on the MEMS device and the CMOS bond pad when eutecticly bonded and also for compensating for the lateral translation of proof mass.

It is appreciated that the roughness may be increased by using material such as polysilicon layer, however, the thickness of polysilicon is limited so that the wafer is not stuck onto the wafer boat in the polysilicon deposition furnace. In some embodiments, sacrificial etch back is used to enhance surface roughness of polysilicon in addition to the use of the dimples features. Moreover, standoff area on the MEMS device is protected during polysilicon surface roughening in order to prevent degradation of eutectic bonding quality between the standoff on the MEMS device and the bond pad on the CMOS device.

FIG. 1 shows a MEMS wafer at an early stage of manufacture according to one aspect of the present embodiments. In some embodiments, a fusion bond oxide 102 fusion bonds a handle silicon wafer 104 to a first side of a device silicon wafer 110 (may also be referred to as the actuator layer). A second side of the device silicon wafer 110 is planar and opposite the first side. In this nonlimiting example, an accel cavity 105 and gyro cavity 106 are formed between the device silicon wafer 110 and the handle silicon wafer 104. It is appreciated that the embodiments are described with respect to two cavities for illustrative purposes and should not be construed as limited thereto. For example, only one cavity may be formed or more than two cavities may be formed.

Figure 2:
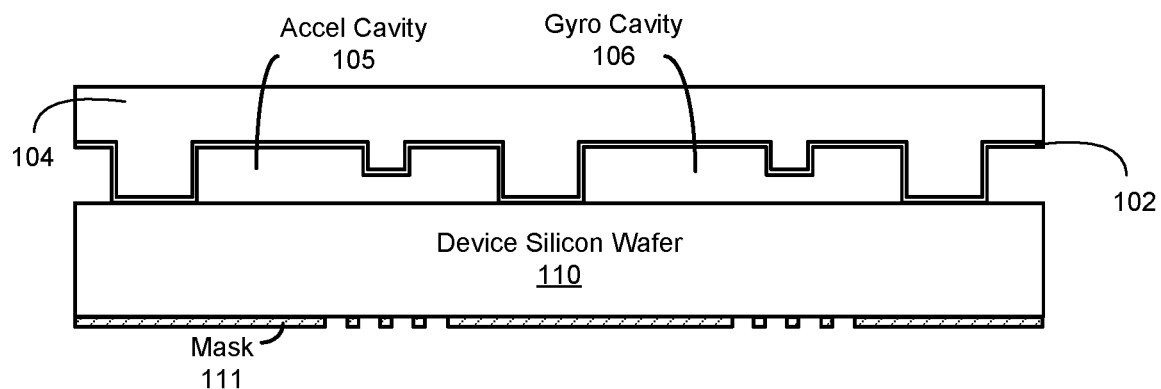
FIG. 2 shows the MEMS wafer after mask deposition and patterning according to one aspect of the present embodiments.

FIG. 2 shows the MEMS wafer after mask deposition and patterning according to one aspect of the present embodiments. A mask 111 may be formed over the planar side of the device silicon wafer 110 and it may subsequently be patterned. In some embodiments, the mask 111 is a photoresist mask.

Figure 3:
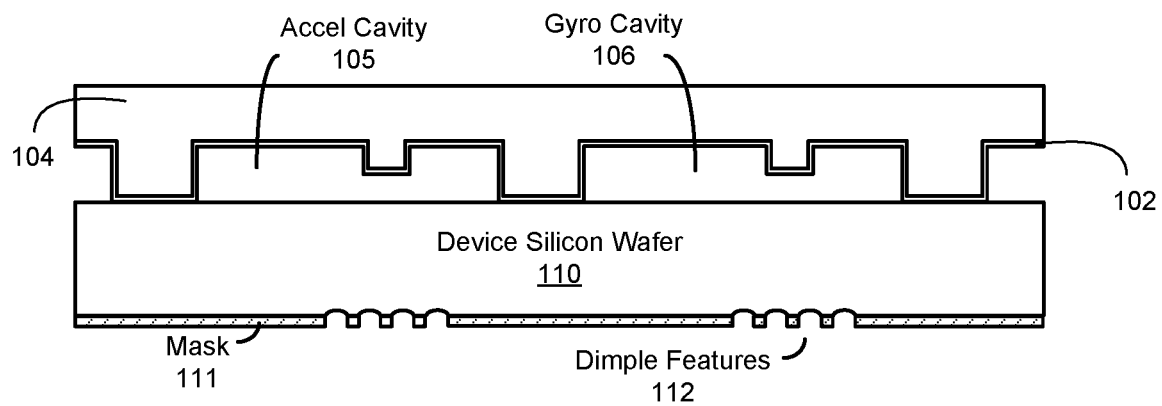
FIG. 3 shows the MEMS wafer after dimple formation according to one aspect of the present embodiments.

FIG. 3 shows the MEMS wafer after dimple formation according to one aspect of the present embodiments. Dimple features 112 are formed through lithography that correspond to exposed portions (i.e. exposed surface of the device silicon wafer 110 that is not covered by the mask 111) of the device silicon wafer 110. It is appreciated that in some embodiments the dimple features 112 are positioned on a small areas that will eventually be above the CMOS bumpstop after the MEMS device is eutecticly bonded to the CMOS bond pad in order to prevent or minimize parametric shifts or changes in the sensor performance. It is appreciated that the dimple features 112 may have any shape, e.g., post, hole, stripe, etc., and that their dimensions may vary, e.g., height, width, spacing, etc. It is also appreciated that one dimple feature may be different from another dimple feature (i.e. its shape and dimension). According to some embodiments, the dimple features 112 are adequately oversized relative to the bumpstop of the CMOS in order to compensate for misalignment between the eutecticly bonding of the standoff of the MEMS with the CMOS bond pad. Additionally, the dimple features 112 are adequately oversized relative to the bumpstop of the CMOS to compensate and account for lateral translation of the MEMS' proof mass.

Figure 4:
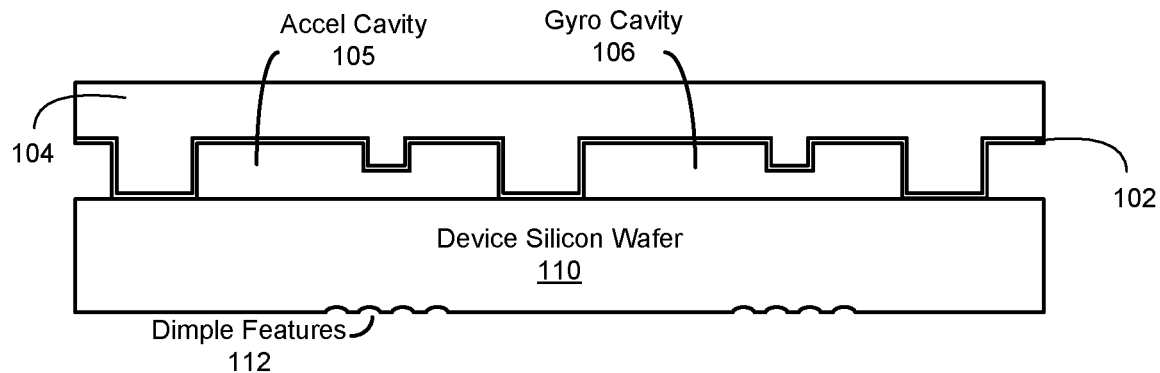
FIG. 4 shows the MEMS wafer after the mask is removed according to one aspect of the present embodiments.

FIG. 4 shows the MEMS wafer after the mask 111 is removed according to one aspect of the present embodiments. In this embodiment, the mask 111 is removed after the dimple features 112 are formed.

Figure 5:
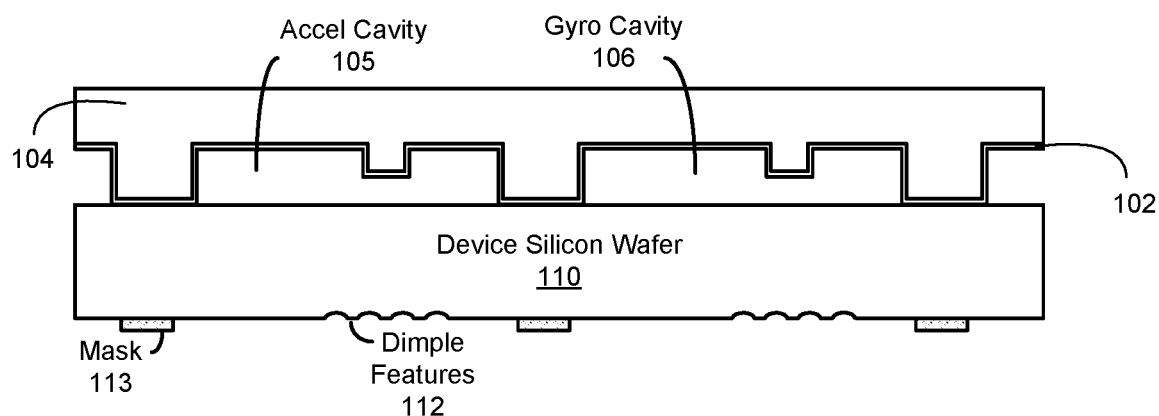
FIG. 5 shows the MEMS wafer after deposition of a mask to form a standoff according to one aspect of the present embodiments.

FIG. 5 shows the MEMS wafer after deposition of a mask to form a standoff according to one aspect of the present embodiments. In some embodiments, a mask 113 (e.g., a hard mask) is deposited on the planar side of the device silicon wafer 110 that now includes the dimple features 112. The mask 113 once deposited may be patterned. The mask 113 protects the area corresponding to the standoff.

Figure 6:
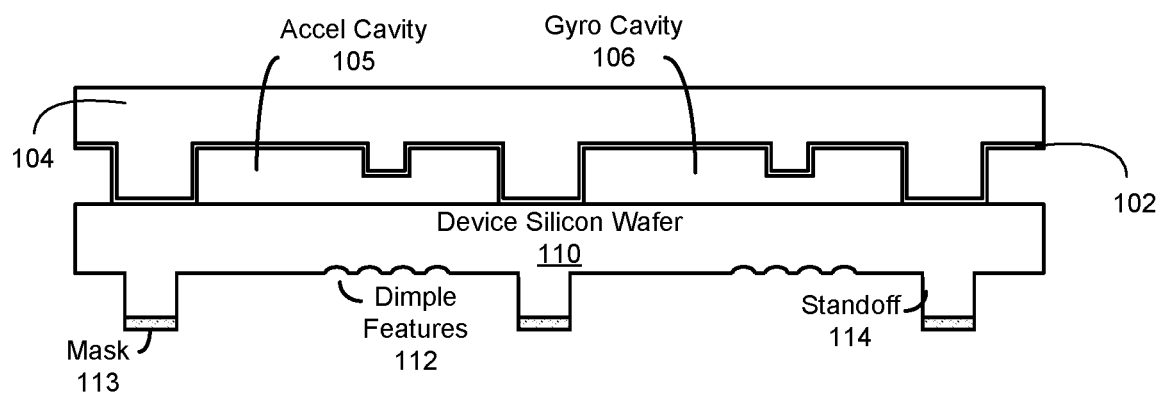
FIG. 6 shows the MEMS wafer after etching to form the standoff according to one aspect of the present embodiments.

FIG. 6 shows the MEMS wafer after etching to form the standoff according to one aspect of the present embodiments. The standoffs 114 may be formed through the etch process. It is appreciated that the exposed portions of the device silicon wafer 110 (i.e. uncovered by the mask 113) is etched back while the protected area (i.e. area covered by the mask 113) is not etched, thereby forming the standoffs 114. It is appreciated that the mask 113 may be removed after the standoffs 114 are formed.

Figure 7:
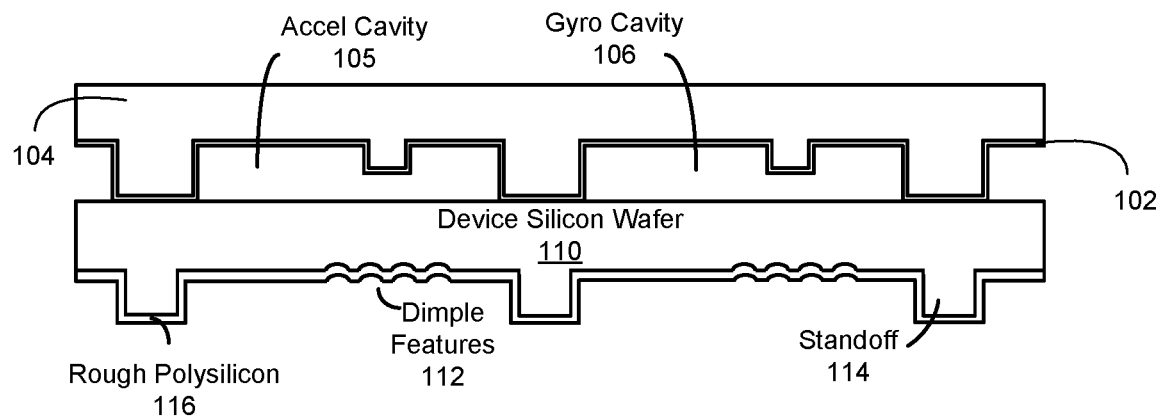
FIG. 7 shows the MEMS wafer after removing the mask and depositing a rough polysilicon layer according to one aspect of the present embodiments.

FIG. 7 shows the MEMS wafer after removing the mask and depositing a rough polysilicon layer according to one aspect of the present embodiments. In some embodiments, a rough polysilicon layer 116 is deposited on the second side of the device silicon wafer 110. In some embodiments, the rough polysilicon layer 116 is deposited directly on the second side of the device silicon wafer 110. It is appreciated that the rough polysilicon layer 116 may be substituted with a different material in order to improve stiction. It is appreciated that in one optional embodiment, a further roughening of the polysilicon surface may be performed through the sacrificial etch back process. It is also appreciated that in one optional embodiment, the standoffs 114 may be protected, e.g., using a mask, prior to further roughening through the etch back process.

Figure 8:
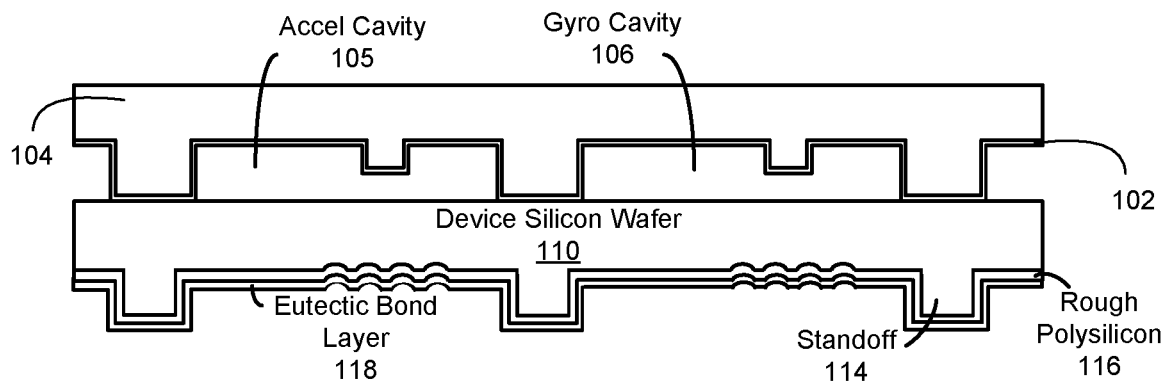
FIG. 8 shows the MEMS wafer after depositing a eutectic bond layer according to one aspect of the present embodiments.

FIG. 8 shows the MEMS wafer after depositing a eutectic bond layer according to one aspect of the present embodiments. A eutectic bond layer 118 such as Germanium is deposited over the rough polysilicon layer 116. It is appreciated that the use of Germanium is for illustrative purposes and should not be construed as limiting the scope of the embodiments. For example, Aluminum or Aluminum Copper may be used in some embodiments.

Figure 9:
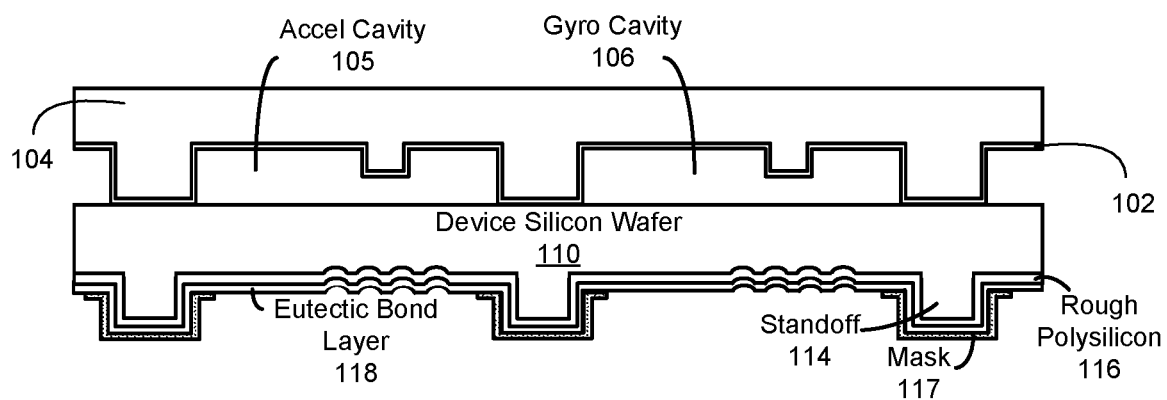
FIG. 9 shows the MEMS wafer after depositing a photoresist mask and patterning over the eutectic bond layer according to one aspect of the present embodiments.
Figure 10:
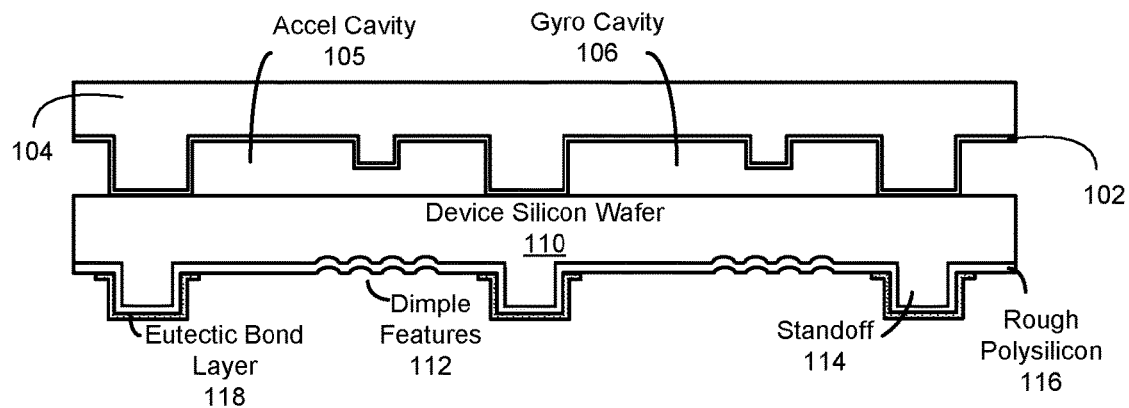
FIG. 10 shows the MEMS wafer after etching through portions uncovered by the photoresist mask and subsequent removal of the photoresist hardmask according to one aspect of the present embodiments.

FIG. 9 shows the MEMS wafer after depositing a photoresist mask and patterning over the eutectic bond layer according to one aspect of the present embodiments. In some embodiments, the eutectic bond layer 118 deposited over the standoffs 114 is to be protected (shown in FIG. 14). Accordingly, a mask 117 may be formed over the eutectic bond layer 118 covering the standoffs 114 in order to protect the eutectic bond layer 118 covering the standoffs 114. The mask 117 may be a photoresist mask. The eutectic bond layer 118 not covered by the mask 117 is removed (not shown), e.g., by etching process. Once the eutectic bond layer 118 that is exposed is etched, the mask 117 may be removed, leaving the eutectic bond layer 118 over the standoffs 114, as shown in FIG. 10.

Figure 11:
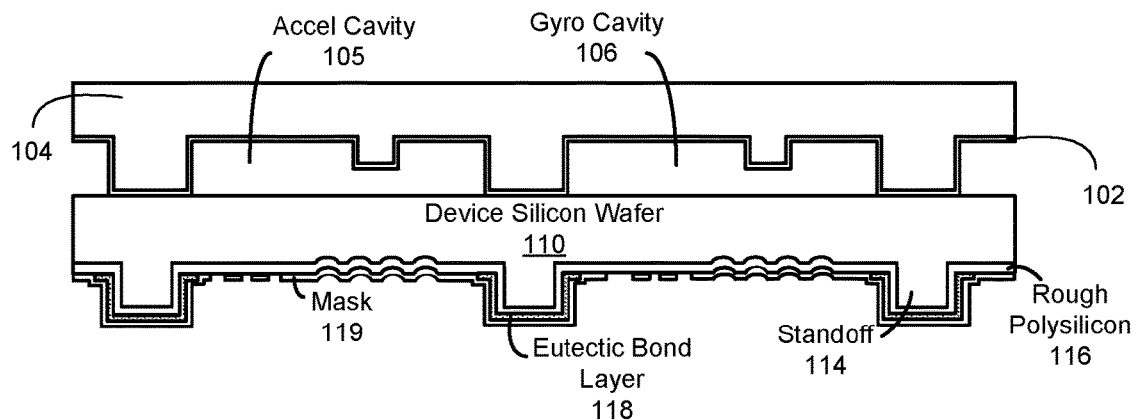
FIG. 11 shows the MEMS wafer after depositing and patterning a mask corresponding to device pattern according to one aspect of the present embodiments.

FIG. 11 shows the MEMS wafer after depositing and patterning a mask corresponding to device pattern according to one aspect of the present embodiments. In some embodiments, a mask 119 may be formed over the rough polysilicon layer 116 and further over the eutectic bond layer 118 that covers the standoffs 114. The mask 119 may be patterned to correspond to device pattern.

Figure 12:
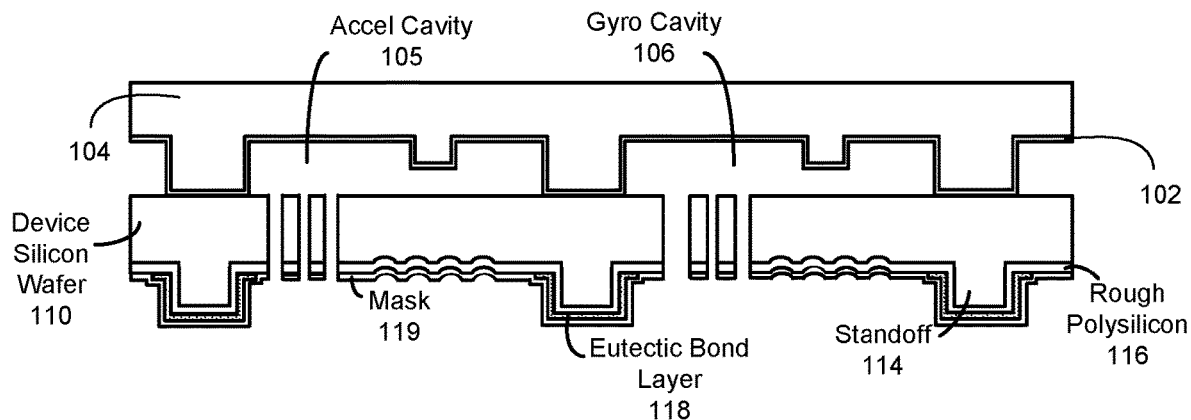
FIG. 12 shows the MEMS wafer after etching MEMS device pattern according to one aspect of the present embodiments.

FIG. 12 shows the MEMS wafer after etching MEMS device pattern according to one aspect of the present embodiments. In some embodiments, the device pattern is etched by etching portions of the device not covered by the patterned mask 119. In some embodiments, the device may be etched through a deep reactive-ion etching (DRIP.

Figure 13:
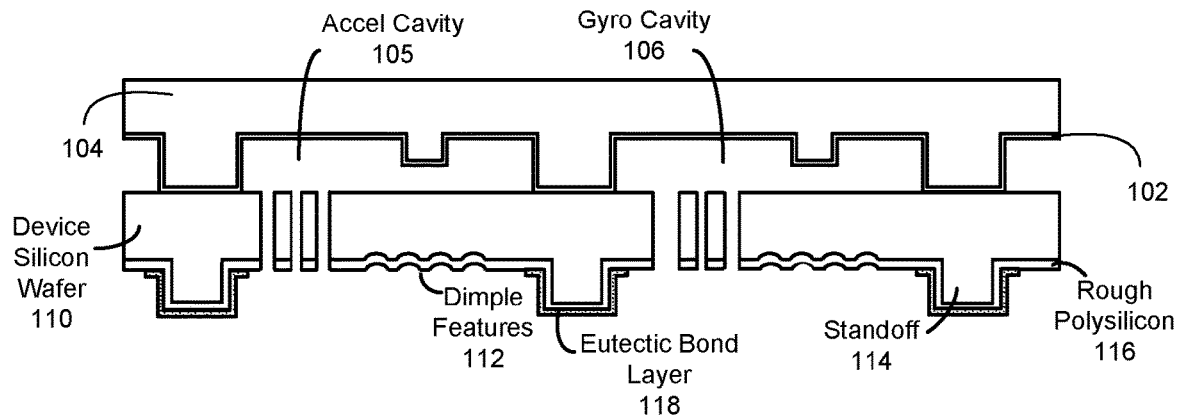
FIG. 13 shows the MEMS after SAM coating according to one aspect of the present embodiments.

FIG. 13 shows the MEMS after self-assembled monolayer (SAM) coating according to one aspect of the present embodiments. Once the device pattern is etched, the mask 119 may be removed. In some optional embodiments, the device may be subjected to a thin oxide to improve the optional application of the SAM coating that operates as an anti-stiction layer to further reduce stiction. It is appreciated that in some embodiments, a thermal and chemical treatment of SAM coating is performed. In one optional embodiment, the SAM layer on the eutectic bond layer 118 may be partially removed.

Figure 14:
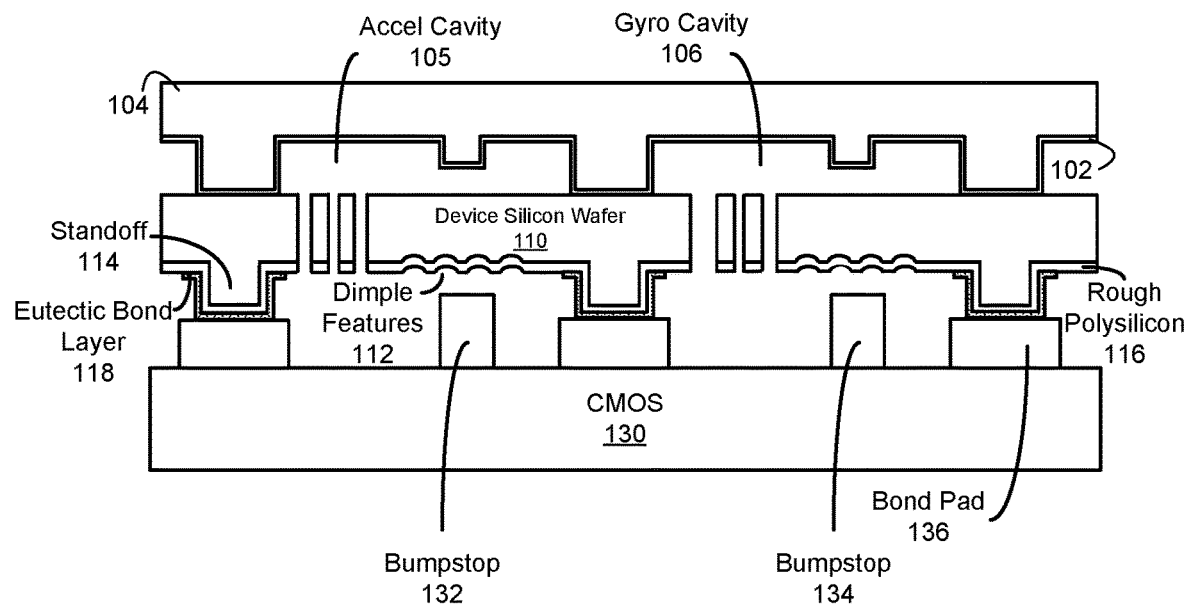
FIG. 14 shows the MEMS after it is eutecticly bonded to a CMOS according to one aspect of the present embodiments.

FIG. 14 shows the MEMS after it is eutecticly bonded to a CMOS according to one aspect of the present embodiments. The CMOS 130 may include bumpstops 132 and 134 that are positioned in an area under the dimple features 112. The standoffs 114 on the MEMS device having the eutectic bond layer 118 is eutecticly bonded to the CMOS bond pad 136.

Figure 15:
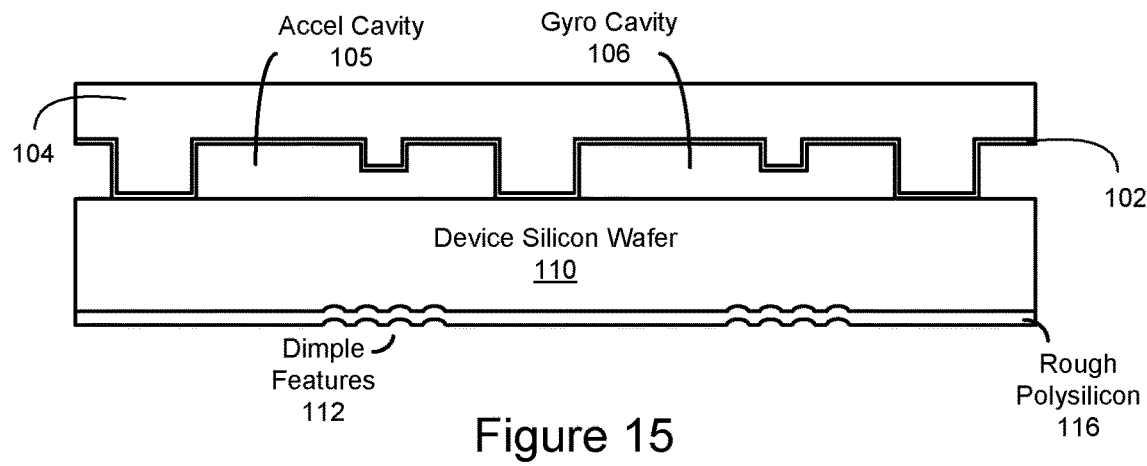
FIG. 15 shows the MEMS wafer after depositing a rough polysilicon layer after the dimple features are formed in FIG. 4 according to one aspect of the present embodiments.

FIG. 15 shows the MEMS wafer after depositing a rough polysilicon layer after the dimple features are formed in FIG. 4 according to one aspect of the present embodiments. This embodiments, described an alternative embodiment of the fabrication process after the dimple features 112 are formed, as shown in FIG. 4. In this nonlimiting example, a rough polysilicon layer 116 is deposited over the second side (i.e. planar) of the device silicon wafer 110 that now has the dimple features 112 formed thereon.

Figure 16:
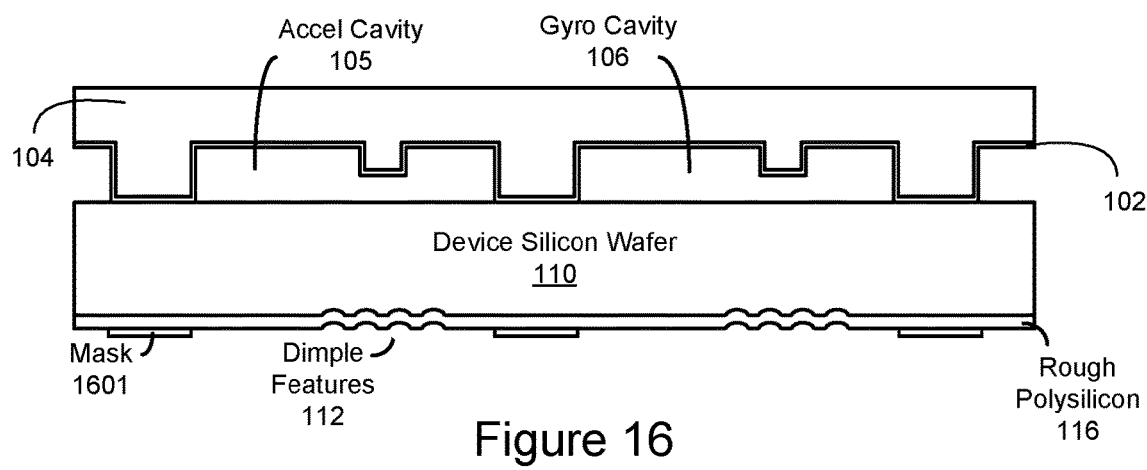
FIG. 16 shows a MEMS wafer of FIG. 15 during polysilicon surface roughening by sacrificial etch back process according to one aspect of the present embodiments.

FIG. 16 shows a MEMS wafer of FIG. 15 during surface roughening of polysilicon layer 116 according to one aspect of the present embodiments. In this optional embodiment, polysilicon 116 surface roughening may be performed through the sacrificial etch back process. In yet another optional embodiment, the area corresponding to the standoffs (not yet formed) may be protected using mask 1601 prior to the etch back process. The mask 1601 is removed after polysilicon surface roughening is performed.

Figure 17:
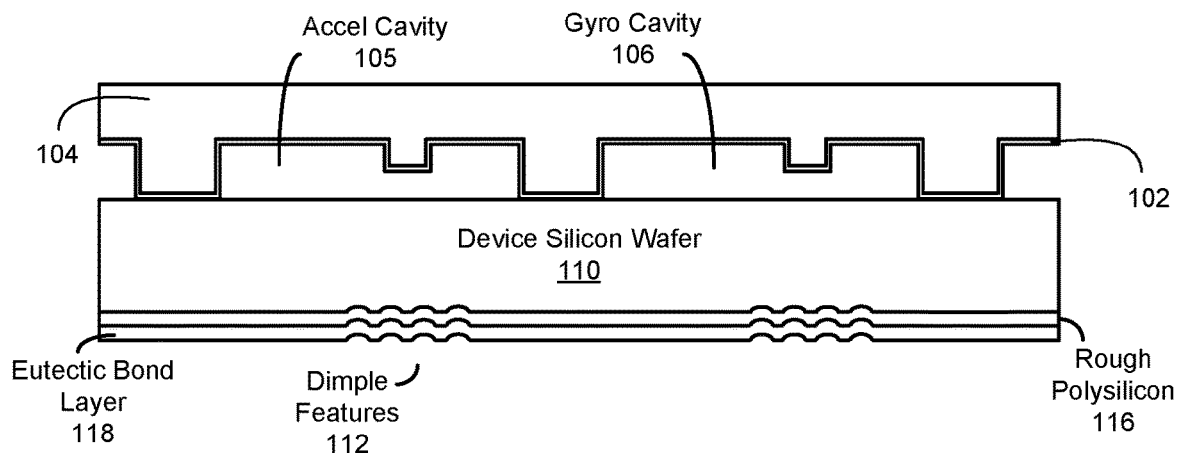
FIG. 17 shows the MEMS wafer after depositing a eutectic bond layer over the rough polysilicon layer according to one aspect of the present embodiments.

FIG. 17 shows the MEMS wafer after depositing a eutectic bond layer over the rough polysilicon layer according to one aspect of the present embodiments. Whether polysilicon surface roughening is performed or not, a eutectic bond layer 118 is deposited over the rough polysilicon layer 116. The eutectic bond layer 118 is similar to the eutectic bond layer described in earlier figures.

Figure 18:
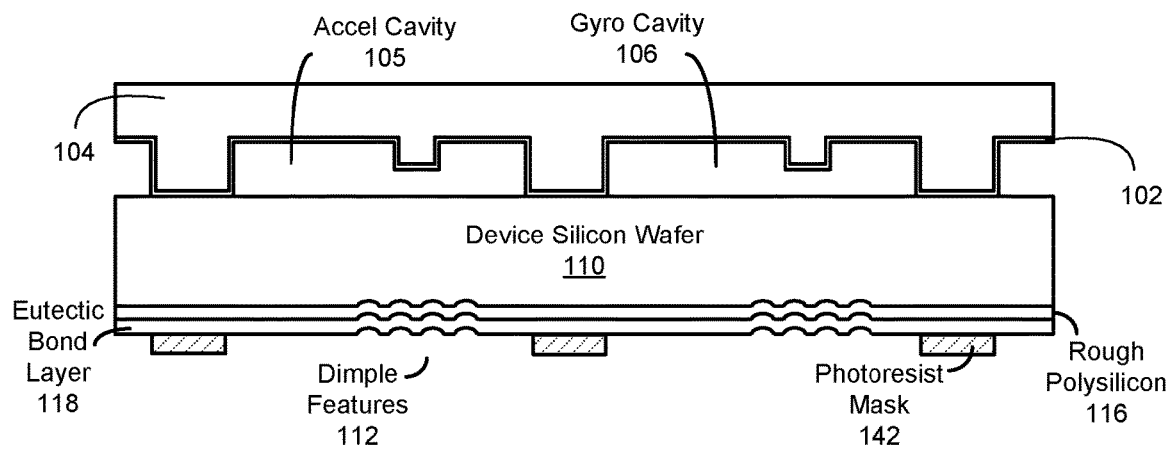
FIG. 18 shows the MEMS wafer of FIG. 17 after a photoresist mask is deposited and patterned to protect a standoff to be formed according to one aspect of the present embodiments.

FIG. 18 shows the MEMS wafer of FIG. 17 after a photoresist mask is deposited and patterned to protect a standoff to be formed according to one aspect of the present embodiments. A photoresist mask 142 may be deposited over the eutectic bond layer 118 that corresponds to the standoffs 1901 (not formed yet). It is appreciated that in some embodiments, the photoresist mask 142 is formed over the eutectic bond layer 118 and it may be patterned such that portion of the device corresponding to the standoffs 1901 to be formed is covered by the photoresist mask 142.

Figure 19:
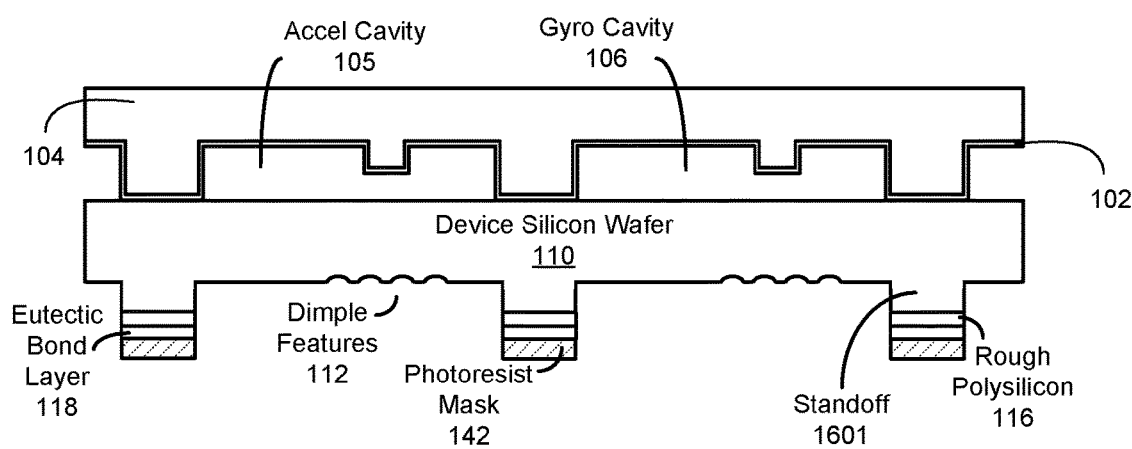
FIG. 19 shows the MEMS wafer after etching to form a standoff according to one aspect of the present embodiments.

FIG. 19 shows the MEMS wafer after etching to form a standoff according to one aspect of the present embodiments. In some embodiments, the portions of the device not covered by the photoresist mask 142 is etched to form the standoffs 1901. In other words the standoff 1601 comprises the material of the device silicon wafer 110, a rough polysilicon layer 116, a eutectic bond layer 118, and the photoresist mask 142 (at this stage that is later removed). It is appreciated that the embodiment as shown in FIG. 19 goes through the process as described in FIGS. 11-14 (above) to form the device pattern and to eutecticly bond the MEMS device to a CMOS device, as described above.

Figure 20A:
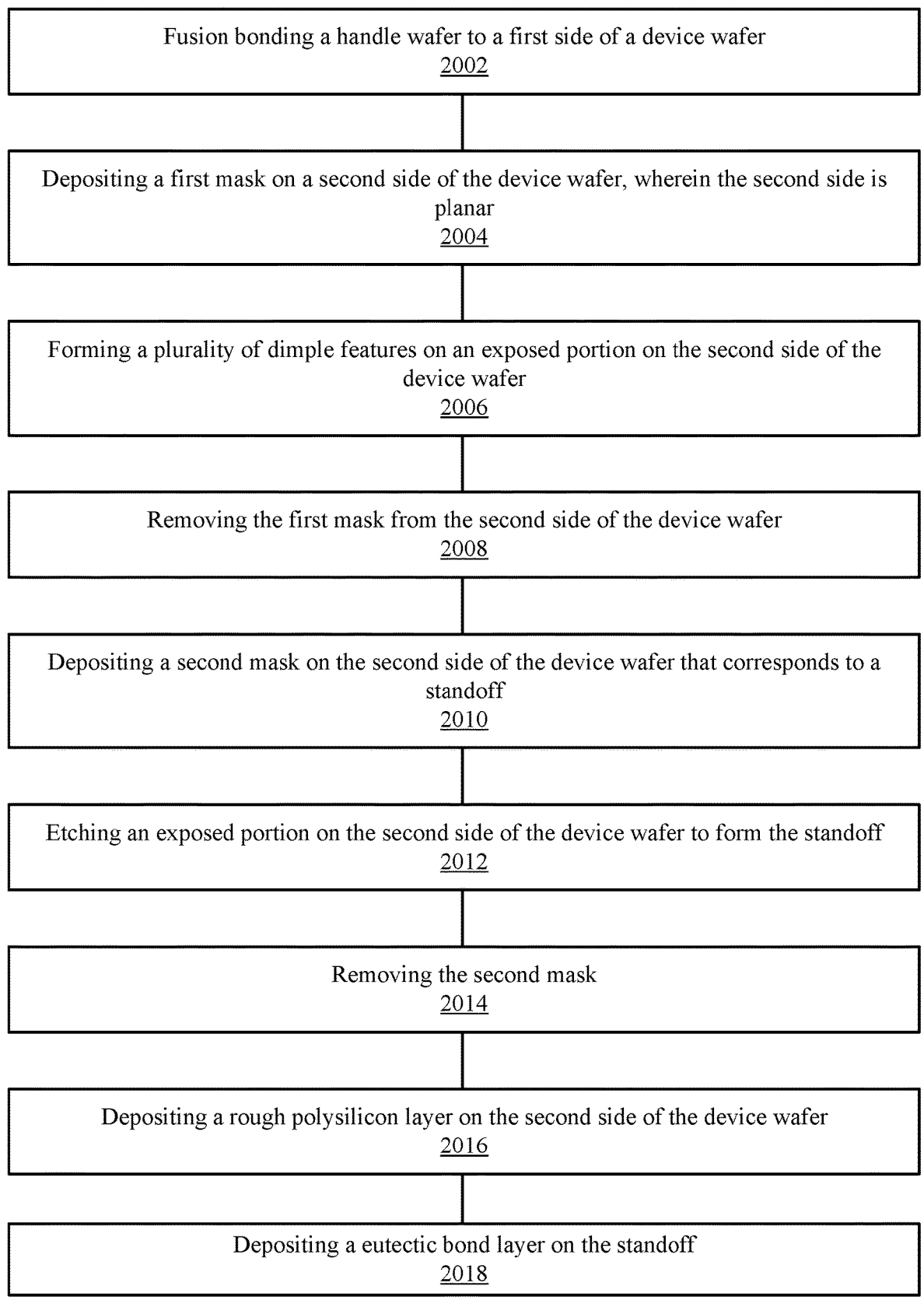

FIGS. 20A-B show an exemplary flow diagram for creating a sensor with improved stiction according to one aspect of the present embodiments. The flow diagram corresponds to FIGS. 1-14, as described above. At step 2002, a handle wafer is fusion bonded to a first side of a device wafer. At step 2004, a first mask is deposited on a second side of the device wafer, where the second side is planar. At step 2006, a plurality of dimple features are formed on an exposed potion on the second side of the device wafer. At step 2008, the first mask is removed from the second side of the device wafer. At step 2010, a second mask is deposited on the second side of the device wafer that corresponds to a standoff. At step 2012, an exposed portion on the second side of the device wafer is etched to form the standoff. At step 2014, the second mask is removed. At step 2016, a rough polysilicon layer is deposited on the second side of the device wafer. It is appreciated that in some optional embodiments, further roughening may be performed through sacrificial etch back of the rough polysilicon layer. In some optional embodiments, a mask may be deposited over the standoffs in order to protect the standoffs from further surface roughening. At step 2018, a eutectic bond layer is deposited on the standoff. It is appreciated that in some embodiments, the eutectic bond layer may be deposited throughout and subsequently patterned such that it covers the standoffs. In some embodiments, at step 2020, a third mask is deposited on the second side of the device wafer and patterned to retain a portion of the third mask that corresponds to the standoff. At step 2022, a fourth mask is deposited on the second side of the device wafer prior to etching the MEMS device pattern. The fourth mask is patterned to remove a portion of the fourth mask that corresponds to the MEMS device pattern. At step 2024, a MEMS device pattern is etched into the device wafer. At step 2026, optionally, the MEMS device pattern, the plurality of dimple features, and interior of the cavity formed between the handle wafer and the device wafer is coated with SAM. At step 2028, the eutectic bond layer on the standoff is eutecticly bonded to a metal pad on a CMOS.

Figure 21:
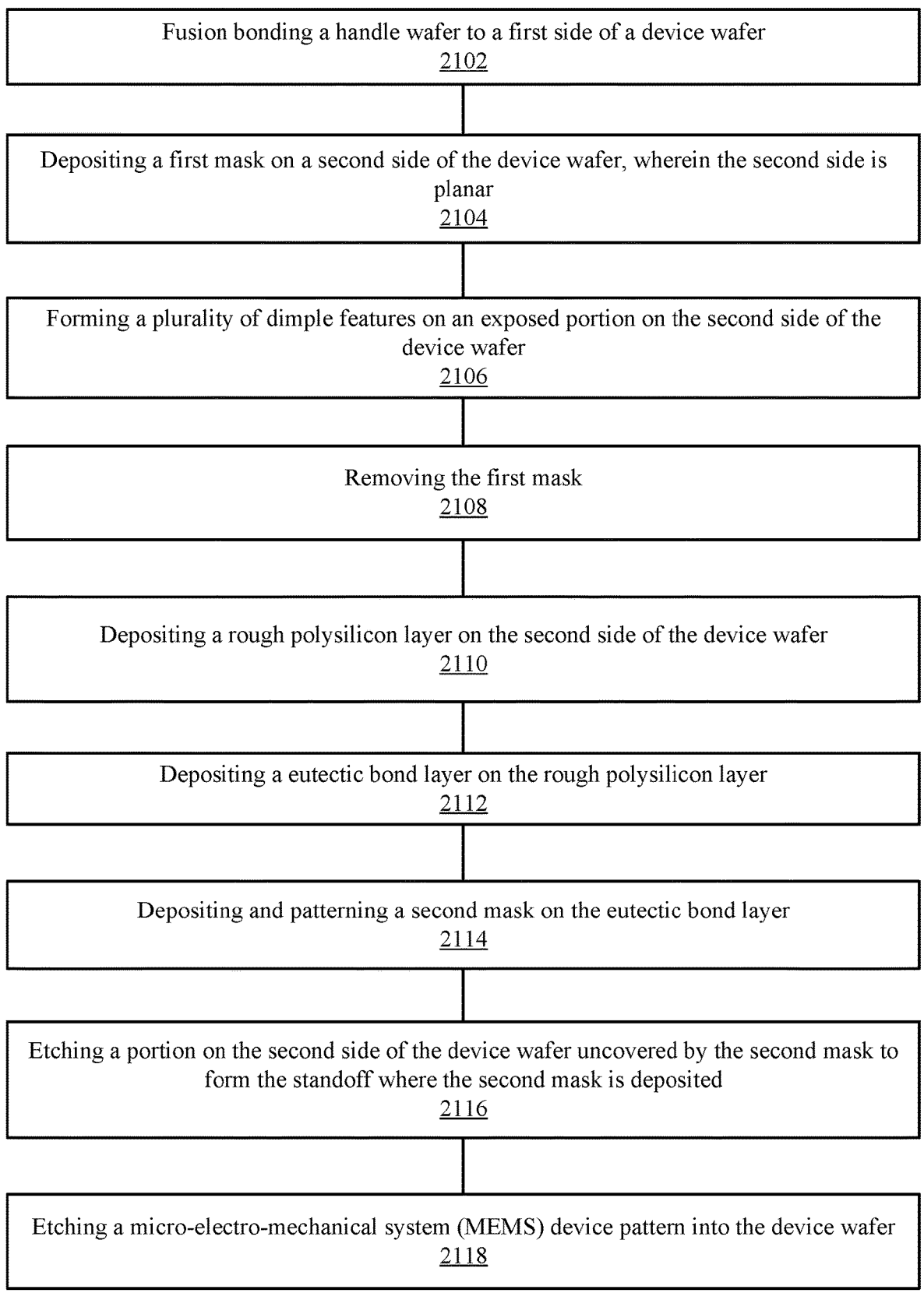
FIG. 21 shows another exemplary flow diagram for creating a sensor with improved stiction according to one aspect of the present embodiments.

FIG. 21 shows another exemplary flow diagram for creating a sensor with improved stiction according to one aspect of the present embodiments. The flow diagram corresponds to FIGS. 15-19, as described above. At step 2102, a handle wafer is fusion bonded to a first side of a device wafer. At step 2104, a first mask is deposited on a second side of the device wafer, there the second side is planar. At step 2106, a plurality of dimple features is formed on an exposed portion on the second side of the device wafer. At step 2108, the first mask is removed. At step 2110, a rough polysilicon layer is deposited on the second side of the device wafer. In some optional embodiments, a mask may be deposited and patterned on the rough polysilicon layer such that the area corresponding to the standoffs to be formed is covered by the mask, and subsequently a further roughening is performed through sacrificial etch back of polysilicon. At step 2112, a eutectic bond layer is deposited on the rough polysilicon layer. In some embodiments, the eutectic bond layer is deposited on the rough polysilicon layer and subsequently patterned such that the eutectic bond layer is left at a location where the standoff will subsequently be formed. At step 2114, a second mask is deposited on the eutectic bond layer and patterned. At step 2116, a portion on the second side of the device wafer uncovered by the second mask is etched to form the standoff where the second mask is deposited. It is appreciated that in some embodiments, the second mask is subsequently removed. In some embodiments, after the standoff is formed a third mask may be deposited and patterned where the pattern corresponds to the device pattern. At step 2118, a MEMS device pattern is etched into the device wafer. In some optional embodiments, a SAM coating is applied to the MEMS device pattern, the plurality of dimple features, and interior of cavity formed between the handle wafer and the device wafer. It is appreciated that the standoff of the MEMS device may be eutecticly bonded to the bond pad of the CMOS.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A device comprising:
a device wafer having a first side opposite a second side, wherein the first side of the device wafer is bonded to a handle wafer, wherein the device wafer includes:
a plurality of dimple features formed on the second side of the device wafer;
one or more standoffs, wherein the one or more standoffs comprises a rough polysilicon layer deposited over the device wafer; and
a micro-electro-mechanical system (MEMS) device pattern formed within the device wafer.

2. The device of claim 1, wherein a conductive layer is formed over the rough polysilicon layer.

3. The device of claim 2, wherein the rough polysilicon layer is formed over the one or more standoffs.

4. The device of claim 3, wherein the conductive layer comprises germanium.

5. The device of claim 3, wherein the conductive layer is a eutectic bond layer.

6. The device of claim 2, wherein the conductive layer comprises germanium.

7. The device of claim 2, wherein the conductive layer is a eutectic bond layer.

8. The device of claim 1, wherein the rough polysilicon layer covers the plurality of dimple features.

9. The device of claim 1 further comprising a semiconductor layer that is eutecticly bonded to the one or more standoffs.

10. The device of claim 9, wherein the semiconductor layer comprises a metal pad over the semiconductor layer.

11. The device of claim 9 further comprising a bumpstop disposed on the semiconductor layer opposing the plurality of dimple features.

12. The device of claim 1 further comprising self-assembled monolayer (SAM) coating the MEMS device pattern, the plurality of dimple features, and interior of cavity formed between the handle wafer and the device wafer.

13. The device of claim 1, wherein an oxide layer lines the handle wafer.

* * * * *